(12) United States Patent
Olson et al.

(10) Patent No.: US 11,990,487 B2
(45) Date of Patent: May 21, 2024

(54) DEVICE WITH A MULTIZONE REFLECTOR HAVING A DISCREET OPENING FOR A SENSOR

(71) Applicant: GENTEX CORPORATION, Zeeland, MI (US)

(72) Inventors: Brian R. Olson, Holland, MI (US); George A. Neuman, Holland, MI (US); Mario F. Saenger Nayver, Holland, MI (US); John S. Anderson, Holland, MI (US)

(73) Assignee: GENTEX CORPORATION, Zeeland, MI (US)

( * ) Notice: Subject to any disclaimer, the term of this patent is extended or adjusted under 35 U.S.C. 154(b) by 302 days.

(21) Appl. No.: 17/237,478

(22) Filed: Apr. 22, 2021

(65) Prior Publication Data

US 2021/0335859 A1    Oct. 28, 2021

Related U.S. Application Data

(60) Provisional application No. 63/014,304, filed on Apr. 23, 2020.

(51) Int. Cl.
*H01L 27/146* (2006.01)
*G02B 1/11* (2015.01)
*G02B 1/14* (2015.01)

(52) U.S. Cl.
CPC ............ *H01L 27/1462* (2013.01); *G02B 1/11* (2013.01); *G02B 1/14* (2015.01); *H01L 27/14603* (2013.01); *H01L 27/14629* (2013.01)

(58) Field of Classification Search
CPC ........... H01L 27/1462; H01L 27/14603; H01L 27/14629; G02B 1/14; G02B 1/11
See application file for complete search history.

(56) References Cited

U.S. PATENT DOCUMENTS 7,042,616 B2 * 5/2006 Tonar ................ H01L 23/49562
                                                 257/E33.059
8,154,418 B2 * 4/2012 Peterson ............. G06F 3/04886
                                                         348/148

(Continued)

FOREIGN PATENT DOCUMENTS

WO       2009020846 A1    2/2009

OTHER PUBLICATIONS

"A.S. Hassanien and Alaa A. Akl, 'Optical characterizations and refractive index dispersion parameters of annealed TiO2 thin films synthesized by RF-sputtering technique at different flow rates of the reactive oxygen gas', Jan. 1, 2020, Elsevier-ScienceDirect, vol. 576, p. 1", (Year: 2020).*

(Continued)

*Primary Examiner* — Lex H Malsawma
*Assistant Examiner* — Bruce R. Smith
(74) *Attorney, Agent, or Firm* — Price Heneveld LLP; Brian James Brewer

(57) ABSTRACT

A reflective member having transflective and substantially opaque regions is disclosed. The transflective region may serve as a sensor opening region. When viewing the member from a first direction, the difference between a total light reflectance of the member at the substantially opaque region and at the sensor opening region is less than five percent. Additionally, when viewing the member from the first direction, the difference between a color reflectance of the member at the substantially opaque region and at the sensor opening region is less than 5 delta C* units. A sensor disposed in a second direction of the sensor opening region of the member is operable to receive light through the member at the sensor opening region. The second direction is opposite the first direction.

10 Claims, 9 Drawing Sheets

(56) References Cited

U.S. PATENT DOCUMENTS

| | | | |
|---|---|---|---|
| 9,274,394 B2* | 3/2016 | Neuman | ............. C03C 17/3618 |
| 2009/0207513 A1 | 8/2009 | Luten et al. | |
| 2014/0126036 A1 | 5/2014 | Neuman et al. | |
| 2019/0163013 A1 | 5/2019 | Cammenga et al. | |
| 2020/0052028 A1* | 2/2020 | Inada | ................ H01L 27/14621 |

OTHER PUBLICATIONS

International Search Report dated Aug. 5, 2021, for corresponding PCT application No. PCT/US2021/028601, 2 pages.
Written Opinion dated Aug. 5, 2021, for corresponding PCT application No. PCT/US2021/028601, 4 pages.
Extended European Search Report dated Sep. 18, 2023, for corresponding European application No. 21791925.7, 9 pages.

* cited by examiner

DEVICE WITH A MULTIZONE REFLECTOR HAVING A DISCREET OPENING FOR A SENSOR

CROSS-REFERENCE TO RELATED APPLICATIONS

This application claims priority under 35 U.S.C. § 119(e) to U.S. Provisional Application No. 63/014,304 filed on Apr. 23, 2020, entitled "DISCREET OPENING" the disclosure of which is hereby incorporated by reference in its entirety.

FIELD OF INVENTION

The present invention relates in general to thin film coatings and, more particularly, to thin film coatings providing a close match in visual appearances between a substantially opaque area and a transflective area of a multi-zone reflector.

BACKGROUND OF INVENTION

Reflective surfaces are commonly used, particularly in the automotive industry. Further, these reflective surfaces are often incorporated into electro-optic devices to provide for variable perceived reflectance for reducing glare. Likewise, sensors are commonly used in the automotive industry. As such, it has become desirable to dispose sensors behind these reflective surfaces. However, disposing these sensors behind the reflective surface often requires a transmissive opening to accommodate the sensor. These openings are relatively easy to see and provide for an undesirable aesthetic appearance. Accordingly, there is a need for an improved reflective surface having a transmissive region to allow sensors to be positioned behind the reflective surface while reducing the visibility of the transmissive region.

SUMMARY

In accordance with the present disclosure, the disadvantages and problems associated with reflective surfaces having transmissive openings have been substantially reduced or eliminated.

In accordance with one aspect of the present disclosure, a device is disclosed. The device may comprise a member having a substantially opaque region and a sensor opening region. The substantially opaque region may comprise a first substrate, a first layer, and a second layer. The first substrate may be substantially transparent in the visible spectrum. The first layer may be disposed in a first direction relative the first substrate and may be substantially opaque in a visible spectrum. In some embodiments, the first layer may be at least one of: chrome, molybdenum, vanadium, ruthenium, and nickel. The second layer may be disposed in the first direction relative the first layer and may be substantially reflective in the visible spectrum. In some embodiments, the second layer may comprise at least one of silver and silver alloy, such as silver gold alloy having approximately seven percent gold by weight. The sensor opening region may comprise the first substrate, a third layer, and the second layer. The third layer may have a high refractive index and may be disposed in the first direction relative the first substrate. In some embodiments, the third layer may be at least one of: silicon, chromium, germanium, tantalum oxide, zirconium oxide, tin oxide, indium tin oxide, or titanium oxide. In some embodiments, the refractive index may be at least about 1.9. The second layer may be disposed in the first direction relative the third layer. When viewed from the first direction, the difference between a total light reflectance of the member at the substantially opaque region and at the sensor opening region may be less than five percent. Additionally, when viewed from the first direction, the difference between a color reflectance of the member at the substantially opaque region and at the sensor opening region may be less than 5 delta C* units. Further, a sensor disposed in a second direction of the sensor opening region of the member may be operable to receive light through the member at the sensor opening region. The second direction may be opposite the first direction. In some embodiments, the transmittance of visible light at the sensor opening region may be about 7 to 15 percent.

In some embodiments, the substantially opaque region may further comprise a fourth layer disposed between the first and second layers. In some such embodiments, the fourth layer may be ruthenium. Additionally, the sensor opening region may comprise the fourth layer disposed between the third and second layers.

In other embodiments, the device may further comprise a second substrate and an electro-optic medium. The second substrate may be disposed in a spaced apart relationship in the first direction relative the member. Additionally, the second substrate may comprise a first electrode. The electro-optic medium may be disposed between the member and the second substrate. Further, the member may comprise a second electrode. In some such embodiments, the second layer may be the second electrode.

In accordance with another aspect of the present disclosure, a device is disclosed. The device may comprise a member having a substantially opaque region and a sensor opening region. The substantially opaque region may comprise a first substrate, a first layer, and a second layer. The first substrate may be substantially transparent in the visible spectrum. The first layer may be disposed in a first direction relative the first substrate and may be substantially opaque in a visible spectrum. In some embodiments, the first layer may comprise at least one of: chrome, molybdenum, vanadium, and nickel. The second layer may be disposed in a second direction relative the first substrate and may be substantially reflective in the visible spectrum. In some embodiments, the second layer may comprise at least one of silver and silver alloy, such as a silver gold alloy having approximately seven percent gold by weight. The second direction may be opposite the first direction. The sensor opening region may comprise the first substrate, a third layer, and the second layer. The third layer may have a high refractive index and may be disposed in the first direction relative the first layer. In some embodiments, the third layer may comprise at least one of: silicon, chromium, germanium, tantalum oxide, zirconium oxide, tin oxide, indium tin oxide, or titanium oxide. Also, in some embodiments, the refractive index of the third layer may be at least about 1.9. The second layer may be disposed in the second direction relative the third layer. When viewed from the second direction, the difference between a total light reflectance of the member at the substantially opaque region and at the sensor opening region may be less than five percent. Additionally, when viewed from the first direction, the difference between a color reflectance of the member at the substantially opaque region and at the sensor opening region may be less than 5 delta C* units. Further, a sensor disposed in the first direction of the sensor opening region of the member may be operable to receive light through the member at the sensor opening region. In some embodiments, the transmittance of visible light at the sensor opening region may be about 7 to 15 percent.

In some embodiments, the member may further comprise a fourth layer. The fourth layer may be disposed between the second layer and the first substrate. In some such embodiments, the fourth layer may comprise ruthenium.

In other embodiments, the device may further comprise a second substrate and an electro-optic medium. The second substrate may be disposed in a spaced apart relationship in the second direction relative the member. Additionally, the second substrate may comprise a first electrode. The electro-optic medium may be disposed between the member and the second substrate. Further, the member may comprise a second electrode. In some such embodiments, the second layer may be the second electrode.

The advantages of certain embodiments of the present disclosure include a reflective surface having a discreet transflective region due to a small difference in the total reflectance and the a low $\Delta C^*$ unit between areas within and without the transflective region. The discreet transflective region has the advantage of a desirable aesthetic appearance where the member appears more uniform. Additionally, some embodiments may have the advantage of not requiring a large area since the transflective region may be created without a graded transition. Further, some embodiments may have the advantage of one or more or all of the layers being of a high deposition rate material. Accordingly, the achievement of the discreet transflective region via the use of the high deposition rate materials, enables simpler and more cost-effective production.

These and other aspects, objects, and features of the present disclosure will be understood and appreciated by those skilled in the art upon studying the following specification, claims, and appended drawings. It will also be understood that features of each embodiment disclosed herein may be used in conjunction with, or as a replacement for, features in other embodiments.

DETAILED DESCRIPTION

Figure 1A:
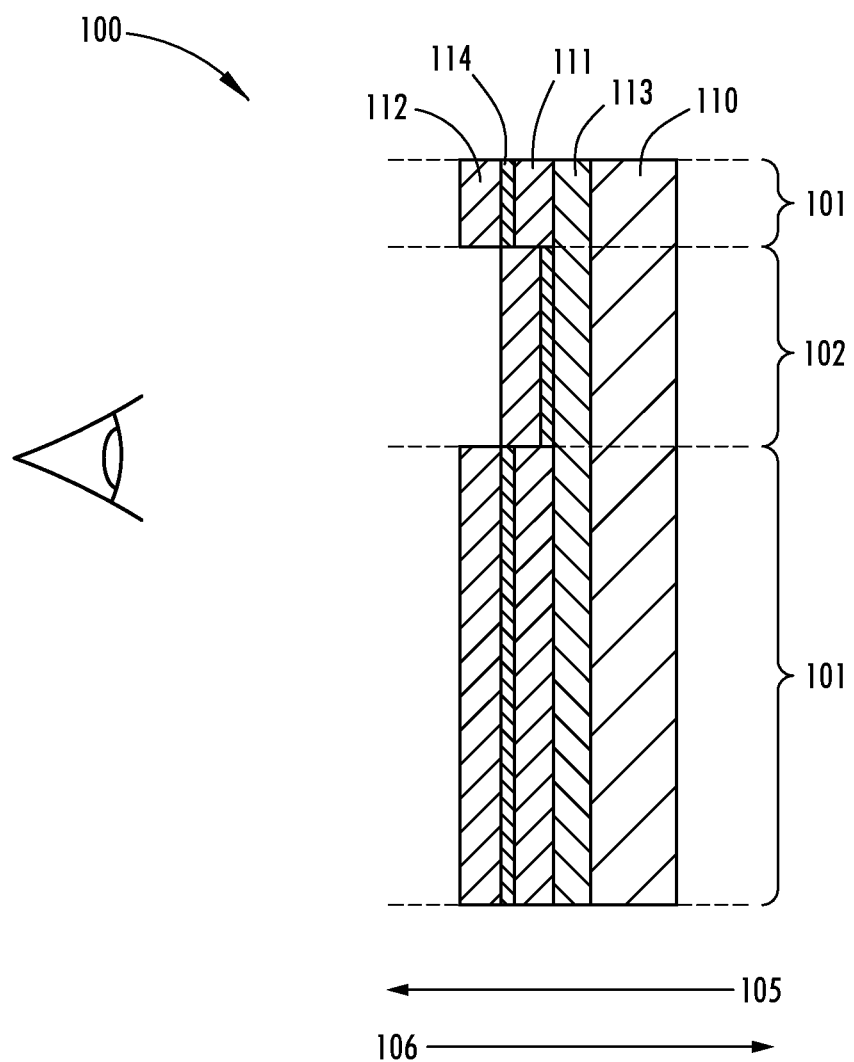
FIG. 1a: A cross sectional schematic representation of an embodiment of a member with a discreet sensor opening.

For the purposes of description herein, the specific devices and processes illustrated in the attached drawings and described in this disclosure are simply exemplary embodiments of the inventive concepts defined in the appended claims. Hence, specific characteristics relating the embodiments disclosed herein are not to be considered as limiting, unless the claims expressly state otherwise.

In discussing color distributions (i.e., spectra of light), it is useful to refer to the Commission Internationale de l'Eclairage's (CIE) 1976 CIELAB Chromaticity Diagram (commonly referred to the L*a*b* chart or quantification scheme). The technology of color is relatively complex, but a fairly comprehensive discussion is given by F. W. Billmeyer and M. Saltzman in *Principles of Color Technology*, $2^{nd}$ Edition, J. Wiley and Sons Inc. (1981). The present disclosure, as it relates to color technology and uses appropriate terminology, generally follows that discussion. As used in this application, Y (sometimes also referred to as Cap Y), represents either the overall reflectance or the overall transmittance, depending on context. L*, a*, and b* can be used to characterize parameters of light in either transmission or reflection. According to the L*a*b* quantification scheme, L* represents brightness and is related to the eye-weighted value of either reflectance or transmittance (also known as normalized Y Tristimulus value) by the Y Tristimulus value of a white reference, Yref: L*=116*(Y/Yref)-16. The a*-parameter is a color coordinate that denotes the color gamut ranging from red (positive a*) to green (negative a*), and b* is a color coordinate that denotes the color gamut ranging from yellow and blue (positive and negative values of b*, respectively). As used in this application, Y (sometimes also referred to as Cap Y), represents the overall reflectance weighted to the human eye's sensitivity to visible light. For example, absorption spectra of an electrochromic medium, as measured at any particular voltage applied to the medium, may be converted to a three-number designation corresponding to a set of L*, a*, and b* values. To calculate a set of color coordinates such as (L*, a*, b*) values from the spectral transmission or reflectance, two additional parameters are required. One is the spectral power distribution of the source or illuminant. The present disclosure uses CIE Standard Illuminant A to simulate light from automobile headlamps and uses CIE Standard Illuminant D65 to simulate daylight. The second parameter is the spectral response of the observer. Many of the examples below refer to a (reflectance) value Y from the 1964 CIE Standard since it corresponds more closely to the spectral reflectance than L*. The value of "color magnitude", or C*, is defined as $C^*=\sqrt{(a^*)^2+(b^*)^2}$, and provides a measure for quantifying color neutrality. The metric of "color difference", or $\Delta C^*$ is defined as $\Delta C^*=\sqrt{(a^*-a^{*\prime})^2+(b^*-b^{*\prime})^2}$, where (a*, b*) and (a*',b*') describe color of light obtained in two different measurements.

A member having a reflective surface may accommodate a sensor located there behind in several manners. While the primary focus of the disclosure may be directed to a sensor, embodiments of the present disclosure are also suitable for light sources, displays, or similar components that may be used in place of the sensor. First, the reflective surface may simply have a non-reflective aperture through which the sensor may be optically aligned. This approach, however, is undesirable as the sensor opening is easily discernable and therefore unaesthetically pleasing. Second, the reflective surface may have a graded transition between an opaque zone and a transflective zone to provide for a seamless appearing transition. Such a graded transition may provide for an aesthetically acceptable appearance; however, these transitions are best suited for instances where the grade can be applied over a relatively large distance. In the instance of a small sensor opening, such as for a glare light sensor, the available distance may be problematic. Third, the reflective surface may be made to be transflective. However, in order to prevent objects behind the member from undesirably being seen, an opaque appliqué is applied to the back of the member. A downside to this approach is that the appliqué may lead to increased cost and production complexity.

The present disclosure is directed to an improved member having a transflective region suited for a sensor where the transflective region has a discreet appearance. Accordingly, the improved member may effectively accommodate a sensor while providing for substantially uniform reflectance thereacross. Further, the improved member may not require a graded opening.

Figure 1B:
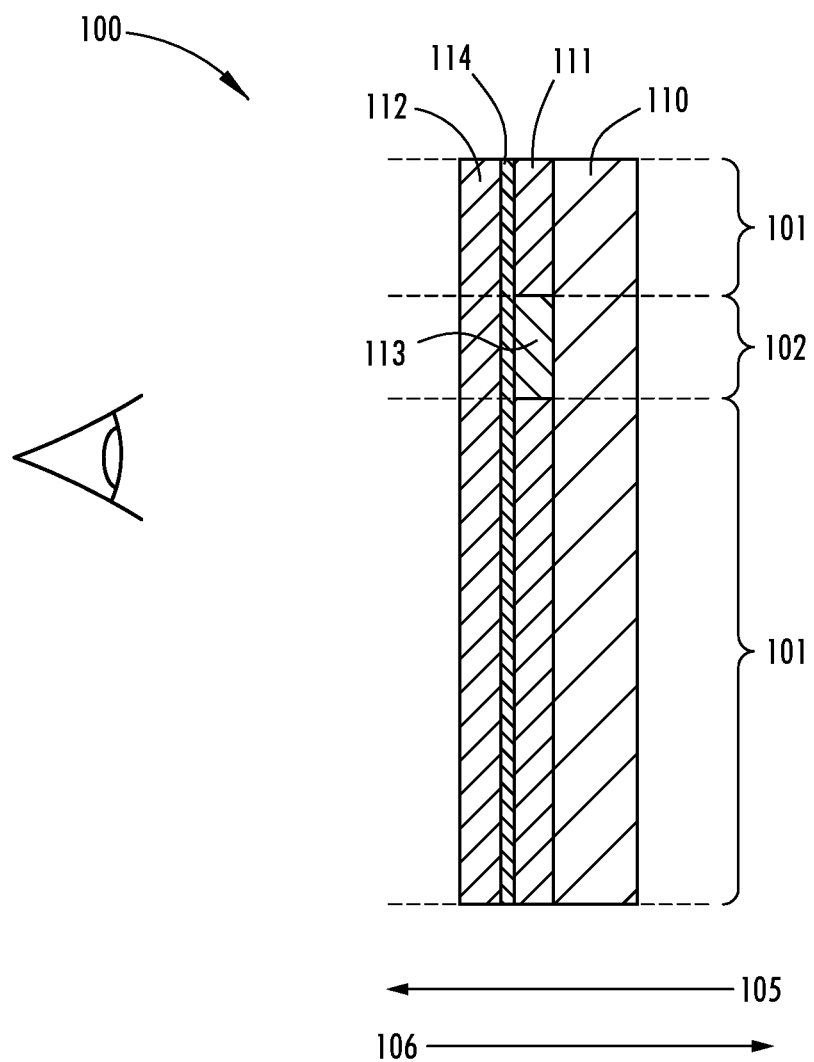
FIG. 1b: A cross sectional schematic representation of an embodiment of a member with a discreet sensor opening.
Figure 1C:
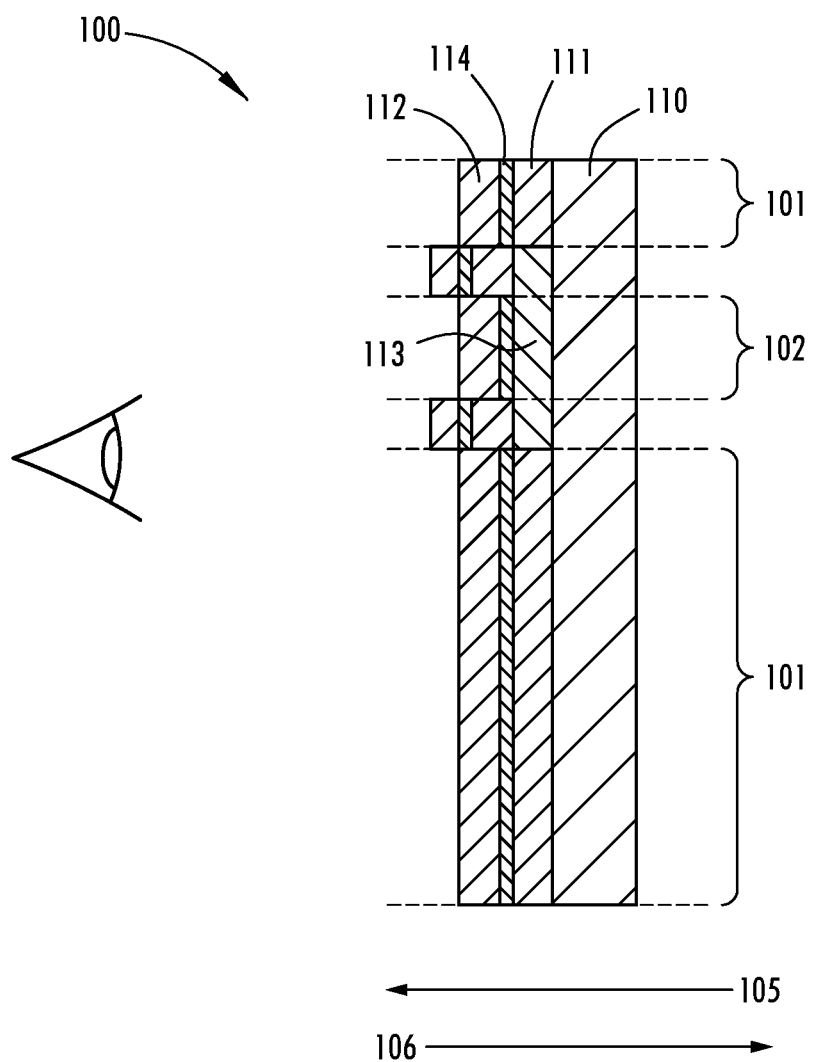
FIG. 1c: A cross sectional schematic representation of an embodiment of a member with a discreet sensor opening.

FIGS. 1a-c are cross sectional schematic representations of embodiments of a member 100 with a discreet sensor opening. Member 100 may be a rearview mirror. Member 100 comprises a substantially opaque region 101 and a transflective region 102. Substantially opaque region 101 may be reflective when from a first direction 105 by an observer. In other words, the observer may be looking in a second direction 106 at member 100. The first direction 105 may be a direction orthogonal the extent of member 100. The second direction 106 is opposite the first direction 105. In some embodiments, the reflectance of substantially opaque region 101 may be equal to and/or less than about 80, 70, 65, 60, 55, 50, 45, or 40 percent. Further, the transmittance of light in opaque region 101 may be equal to and/or less than about 5, 4, 3, 2, 1, 0.5, or 0.1 percent. Transflective region 102 may have a transmittance equal to and/or greater than about 6, 8, 10, 15, 25, or 35 percent. Transflective region 102 may also have a reflectance of light from the first direction 105 equal to and/or greater than about 40, 45, 50, 55, 60, 65, 70, or 80 percent. Transflective region 102 may be a sensor opening region. In some embodiments, transflective region 102 may be circular. Member 100 may comprise a first substrate 110, a first layer 111, a second layer 112, and a third layer 113. Additionally, in some embodiments, member 100 may further comprise a fourth layer 114.

First substrate 110 may be a transparent or substantially transparent material. For example, first substrate 110 may be borosilicate glass, soda lime glass, float glass, natural and synthetic polymeric resins, plastics, and/or composites including Topas®, which is commercially available from Topas Advance Polymers. While particular substrate materials are disclosed, for illustrative purposes only, numerous other substrate materials may likewise be used.

As shown in FIGS. 1a-c, the first, second, third, and fourth layers 111-114 may be selected such that transflective region 102 is discreet with respect to an individual viewing member 100. Accordingly, the layers 111-114 are selected such that, when viewed from the first direction 105, a difference (ΔY) between a total light reflectance of first member 100 at substantially opaque region 101 and at transflective region 102 is less than or equal to ten, five, four, three, two, or one percent. Additionally, a difference between a color reflectance of first member 100 at substantially opaque region 101 and at transflective region 102 may be small. For example, the difference in color reflectance may be less than or equal to ten, five, four, three, two, or one ΔC* units, when viewed from the first direction 105. In some embodiments, in addition to a small color difference, the color reflected may be of a neutral pallet. Accordingly, in some embodiments, the absolute value of the a* and/or b* reflected color metrics may be less than or equal to about 10, 7.5, or 5.0. Likewise, the C* metric may be less than or equal to about 15, 10, 5.0.

First layer 111 may be an opaque or substantially opaque material. For example, first layer 111 may be chrome, molybdenum, vanadium, ruthenium, nickel, or other suitable metal or light absorbing material. Further, first layer 111 may be disposed in the first direction 105 relative first substrate 110. The first direction 105 may be perpendicular to a surface of first substrate 110. In some embodiments, first layer 111 may be in abutting contact with first substrate 110. First layer 111 may additionally be discontinuous, having one or more openings therein. Specifically, first layer 111 may be disposed in substantially opaque region 101 and transflective region 102 defined by the absence of first layer 111. Additionally, the thickness of first layer 111 may be selected to attain a desired level of opacity in opaque region 101 for a given embodiment. For example, first layer 111 may be equal to or about 20, 35, 50, 75, or 100 nm thick.

Second layer 112 may be a reflective layer. For example, second layer 112 may be silver or a silver alloy, such as a silver gold alloy. In some embodiments, the silver gold alloy may be 7 percent gold and 93 percent silver by weight. Likewise, other silver alloy compositions or compatible reflector metals may be used. Additionally, the thickness of second layer 112 may be selected to attain a desired level of reflectance for a given embodiment. For example, second layer 112 may be about 5, 7, 8, 9, 10, 11, 12, 13, 14, 15, or 20 nm thick. Further, second layer 112 may be disposed in the first direction 105 relative first layer 111. In some embodiments, second layer 112 may be in abutting contact with first layer 111. In other embodiments, second layer 112 may be disposed in a spaced apart relationship with first layer 111. Second layer 112 may additionally be non-linearly disposed where portions thereof are not disposed on the same plane. Second layer 112 may be disposed in substantially opaque region 101 and transflective region 102 of member 100.

Third layer 113 may be a layer having a high refractive index. The refractive index may be equal to or greater than about 1.9, 2.0, 2.1, 2.2, 2.3 2.4, 3.0, 3.5, 4.0, 4.5. Further, third layer 213 may be equal to and/or less than about 100, 80, 60, 40, 35, 30, 25, 20, 15, 10, or 5 nm in thickness. Third layer 113, for example, may be silicon, silicon carbide, chromium, germanium, tantalum oxide, zirconium oxide, tin oxide, indium tin oxide, titanium oxide, semiconductor, or other suitable high refractive index material. Further, third layer 113 may be disposed in the first direction 105 relative first substrate 110. In some embodiments, third layer 113 may be in abutting contact with first substrate 110. In some embodiments, third layer 113 may be disposed substantially cross an entire extent of first substrate 110 (FIG. 1a). Accordingly, third layer 113 may be disposed in substantially opaque region 101 and transflective region 102 of member 100. In other embodiments, third layer 113 may be disposed limited to or substantially limited to transflective region 102 (FIG. 1b) and/or an immediate area about transflective region 102 (FIG. 1c).

While visible light performance is often important, in some embodiments, other regions of the electromagnetic spectrum may be important. For example, the near infra-red (NIR) region may be important, particularly in when member 100 is used in conjunction with an emitter or sensor that operates in the NIR region. The discreet opening technology taught herein may accordingly be adapted for NIR applications. In particular, the use of semiconductor layers, such as silicon, in third layer 113 may result in increased transmittance in the NIR region while maintaining small optical differences between substantially opaque region 101 and a transflective region 102 in the visible region. In some embodiments, a semiconductor, such as silicon, may have enhanced transmission in the NIR region relative the visible transmittance. For example, the NIR transmittance may be equal to or greater than about 1.25, 1.5, or 1.75 times the visible transmittance.

In other embodiments, a neutral transmitted color may of particular importance. Specifically, when member 100 is used in conjunction with a visible display or imager. In such an embodiment, third layer 113 may be comprised of $TiO_2$, SiC, or the like. Therefore, absolute values of transmitted a* and/or b* color metrics may be obtained at equal to or less than about 12, 7.5, or 5.0.

Fourth layer 114 may be an adhesion or stabilization layer. For example, fourth layer 114 may be a layer to promote adhesion between first layer 111, second layer 112, and/or third layer 113. In some embodiments, fourth layer 114 may be ruthenium, rhodium, molybdenum, iridium, palladium, nickel, rhenium, and platinum. Further, fourth layer 114 may be disposed in the first direction 105 relative first layer 111 and/or in a second direction 106 relative second layer 112. The second direction 106 being opposite the first direction 105. In some embodiments, fourth layer 114 may be in abutting contact with first layer 111 and/or second layer 112. Additionally, fourth layer 114 may be disposed in substantially opaque region 101 and/or transflective region 102 of member 100. Fourth layer 114 may also be non-linearly disposed where portions thereof are not disposed in the same plane. The thickness of fourth layer 114 may be selected to attain a desired reflectance match, reflectance intensity, and/or transmittance intensity. In some embodiments, fourth layer 114 may be between 0.5 and 15 nm in thickness.

Figure 2A:
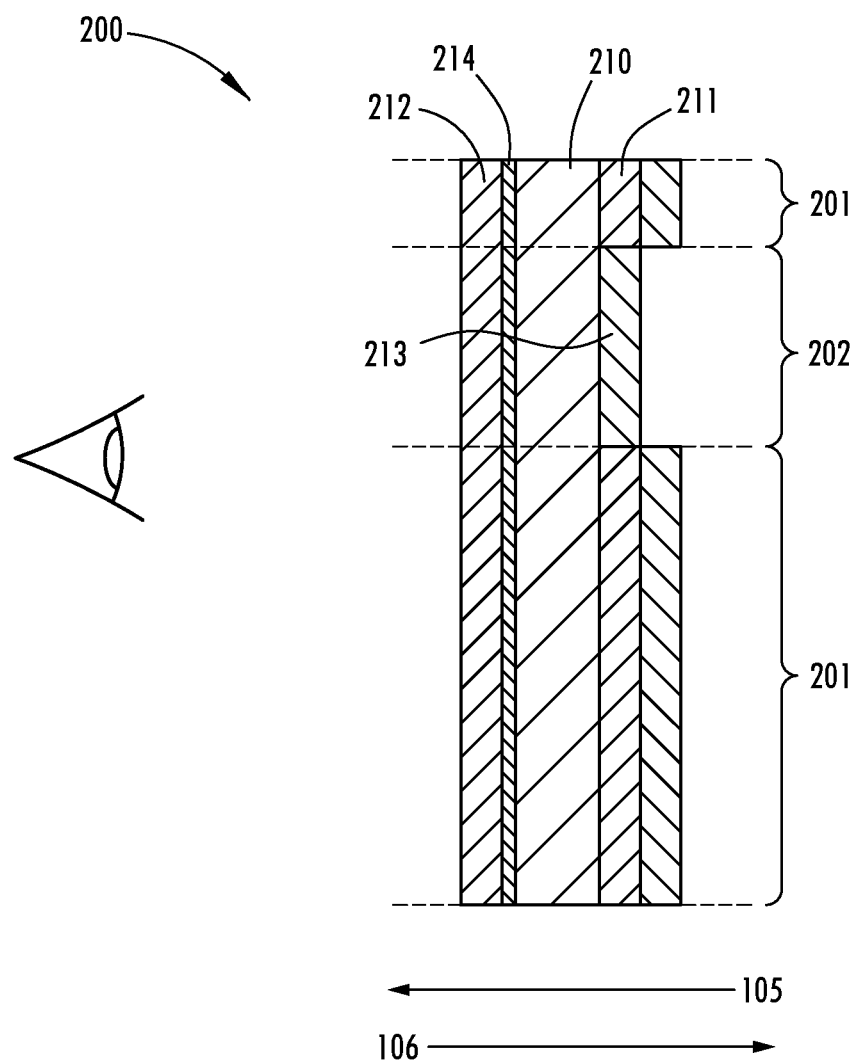
FIG. 2a: A cross sectional schematic representation of an embodiment of a member with a discreet sensor opening.
Figure 2B:
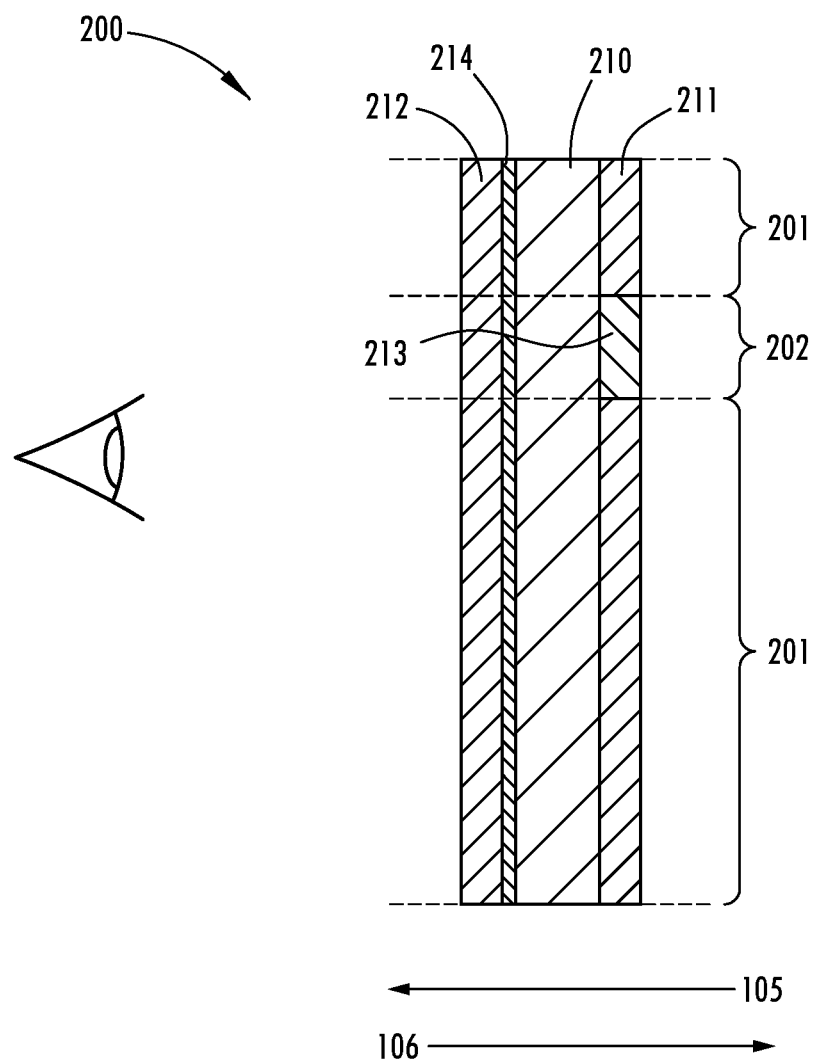
FIG. 2b: A cross sectional schematic representation of an embodiment of a member with a discreet sensor opening.
Figure 2C:
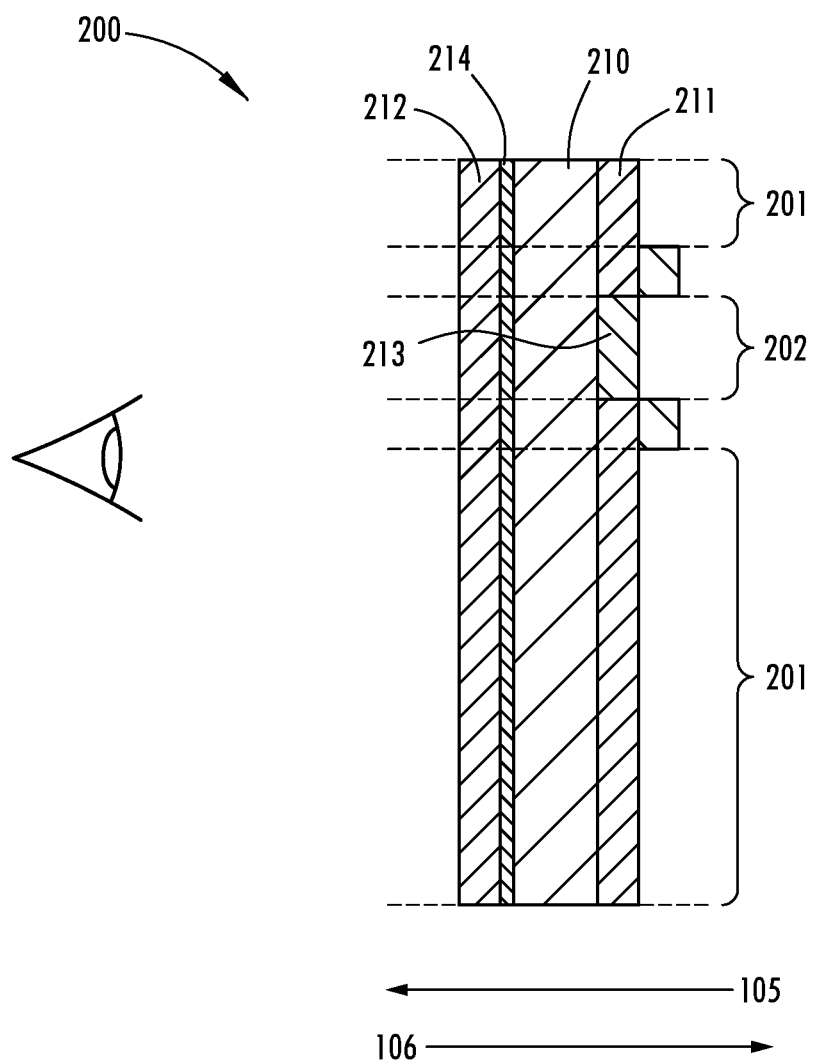
FIG. 2c: A cross sectional schematic representation of an embodiment of a member with a discreet sensor opening.

FIGS. 2a-c are cross sectional representations of a member 200 with a discreet sensor opening. Member 200 may be a rearview mirror. Member 200 comprises a substantially opaque region 201 and a transflective region 202. Substantially opaque region 201 may be reflective when viewed from a first direction 105. The first direction 105 may be orthogonal the extent of member 200. In some embodiments, the reflectance of substantially opaque region 201 may be equal to and/or less than about 80, 70, 65, 60, 55, 50, 45, or 40 percent. The transmittance of light in substantially opaque region 201 may be equal to and/or less than about 5, 4, 3, 2, 1, 0.5, or 0.1 percent. Transflective region 202 may have a transmittance equal to and/or greater than about 6, 8, 10, 15, 25, or 35 percent. Transflective region 202 may also have a reflectance of light from the first direction 105 equal to or greater than about 40, 45, 50, 55, 60, 65, 70, or 80 percent. Transflective region 202 may be a sensor opening region. In some embodiments, transflective region 102 may be circular. Member 200 may comprise a first substrate 210, a first layer 211, a second layer 212, and a third layer 213. Additionally, in some embodiments, member 200 may further comprise a fourth layer 214.

First substrate 210 may be a transparent or substantially transparent material. For example, first substrate 210 may be borosilicate glass, soda lime glass, float glass, natural and synthetic polymeric resins, plastics, and/or composites including Topas®, which is commercially available from Topas Advance Polymers. While particular substrate materials are disclosed, for illustrative purposes only, numerous other substrate materials may likewise be used.

As shown in FIGS. 2a-c, the first, second, third, and fourth layers 211-214 may be selected such that transflective region 202 is discreet with respect to an viewing member 200 taken individually. Accordingly, the layers 211-214 are selected such that, when viewed from the first direction 105, a difference (ΔY) between a total light reflectance of member 200 at substantially opaque region 201 and at transflective region 202 is less than or equal to ten, five, four, three, two, or one percent. Additionally, a difference between a color reflectance of member 200 at substantially opaque region 201 and at transflective region 202 may be small. For example, the difference in color reflectance may be less than or equal ten, five, four, three, two, or one ΔC* units, when viewed from the first direction 105. In some embodiments, in addition to a small color difference, the color reflected may be of a neutral pallet. Accordingly, in some embodiments, the absolute value of the a* and/or b* reflected color metrics may be less than or equal to about 10, 7.5, or 5.0. Likewise, the C* metric may be less than or equal to about 15, 10, 5.0.

First layer 211 may be an opaque or substantially opaque material. For example, first layer 211 may be chrome, molybdenum, vanadium, ruthenium, nickel, or other suitable metal or light absorbing material. Further, first layer 211 may be disposed in the second direction 106 relative first substrate 210. The first direction 105 may be perpendicular to a surface of first substrate 210. In some embodiments, first layer 211 may be in abutting contact with first substrate 210. First layer 211 may additionally be discontinuous, having one or more openings therein. Specifically, first layer 211 may be disposed in substantially opaque region 201 and transflective region 202 defined by the absence of first layer 211. Additionally, the thickness of first layer 211 may be selected to attain a desired level of opacity in opaque region 101 for a given embodiment. For example, first layer 211 may be equal to or about 20, 35, 50, 75, or 100 nm thick.

Second layer 212 may be a reflective layer. For example, second layer 212 may be silver or a silver alloy, such as a silver gold alloy. In some embodiments, the silver gold alloy may be 7 percent gold and 93 percent silver by weight. Likewise, other silver alloy compositions or compatible reflector metals may be used. Additionally, the thickness of second layer 212 may be selected to attain a desired level of reflectance for a given embodiment. For example, second layer 212 may be about 10 to 35 nm thick. Further, second layer 212 may be disposed in the first direction 105 relative first layer 211. In some embodiments, second layer 212 may be in abutting contact with first substrate 210. In other embodiments, second layer 212 may be disposed in a spaced apart relationship with first substrate 210. Second layer 212 may be disposed in substantially opaque region 201 and transflective region 202 of member 200. In some embodiments, second layer 212 may be omitted.

Third layer 213 may be a layer having a high refractive index. The refractive index may be equal to or greater than about 1.9, 2.0, 2.1 2.2, 2.3, 2.4, 3.0, 3.5, 4.0, 4.5. Further, third layer 213 may be equal to and/or less than about 100, 80, 60, 40, 35, 30, 25, 20, 15, 10, or 5 nm in thickness. Third layer 213, for example, may be silicon, chromium, tantalum oxide, zirconium oxide, tin oxide, indium tin oxide, titanium oxide, semiconductor, or other suitable high refractive index material. Further, third layer 213 may be disposed in the second direction 106 relative first layer 211. In some embodiments, third layer 213 may be in abutting contact with first layer 211. In other embodiments, third layer 213 may be disposed in a spaced apart relationship with first layer 211. In some embodiments, third layer 213 may be disposed substantially cross an entire extent of first substrate 210 (FIG. 2a). Accordingly, third layer 213 may be disposed in substantially opaque region 201 and transflective region 202 of member 200. In other embodiments, third layer 213 may be disposed limited to or substantially limited to transflective region 202 (FIG. 2b) and/or an immediate area about transflective region 202 (FIG. 2c).

While visible light performance is often important, in some embodiments, other regions of the electromagnetic spectrum may be important. For example, the near infra-red (NIR) region may be important, particularly in when member 200 is used in conjunction with an emitter or sensor that operates in the NIR region. The discreet opening technology taught herein may accordingly be adapted for NIR applications. In particular, the use of semiconductor layers, such as silicon, in third layer 213 may result in increased transmittance in the NIR region while maintaining small optical differences between substantially opaque region 201 and a transflective region 202 in the visible region. In some embodiments, a semiconductor, such as silicon, may have enhanced transmission in the NIR region relative the visible transmittance. For example, the NIR transmittance may be equal to or greater than about 1.25, 1.5, or 1.75 times the visible transmittance.

In other embodiments, a neutral transmitted color may of particular importance. Specifically, when member 200 is used in conjunction with a visible display or imager. In such an embodiment, third layer 213 may be comprised of $TiO_2$, SiC, or the like. Therefore, absolute values of transmitted a* and/or b* color metrics may be obtained at equal to or less than about 12, 7.5, or 5.0.

Fourth layer 214 may be an adhesion or stabilization layer. For example, fourth layer 214 may be a layer to promote adhesion between second layer 212 and first substrate 210. In some embodiments, fourth layer 214 may be ruthenium, rhodium, molybdenum, iridium, palladium, nickel, rhenium, and platinum. Further, fourth layer 214 may be disposed in the first direction 105 relative first substrate 210 and/or in a second direction 106 relative second layer 212. In some embodiments, fourth layer 214 may be in abutting contact with first substrate 210 and/or first layer 211. Additionally, fourth layer 214 may be disposed in substantially opaque region 201 and/or transflective region 202 of member 200. In some embodiments, additional layers, such as a color neutralizing layer, may be present between first substrate 210 and fourth layer 214. For example, a bi-layer of $TiO_2$ and indium tin oxide (ITO) may be the color neutralizing layer. The thickness of fourth layer 214 may be selected to attain a desired reflectance match, reflectance intensity, and/or transmittance intensity. In some embodiments, fourth layer 214 may be between 0.5 and 15 nm in thickness. In some embodiments, fourth layer 214 may be omitted.

Figure 3:
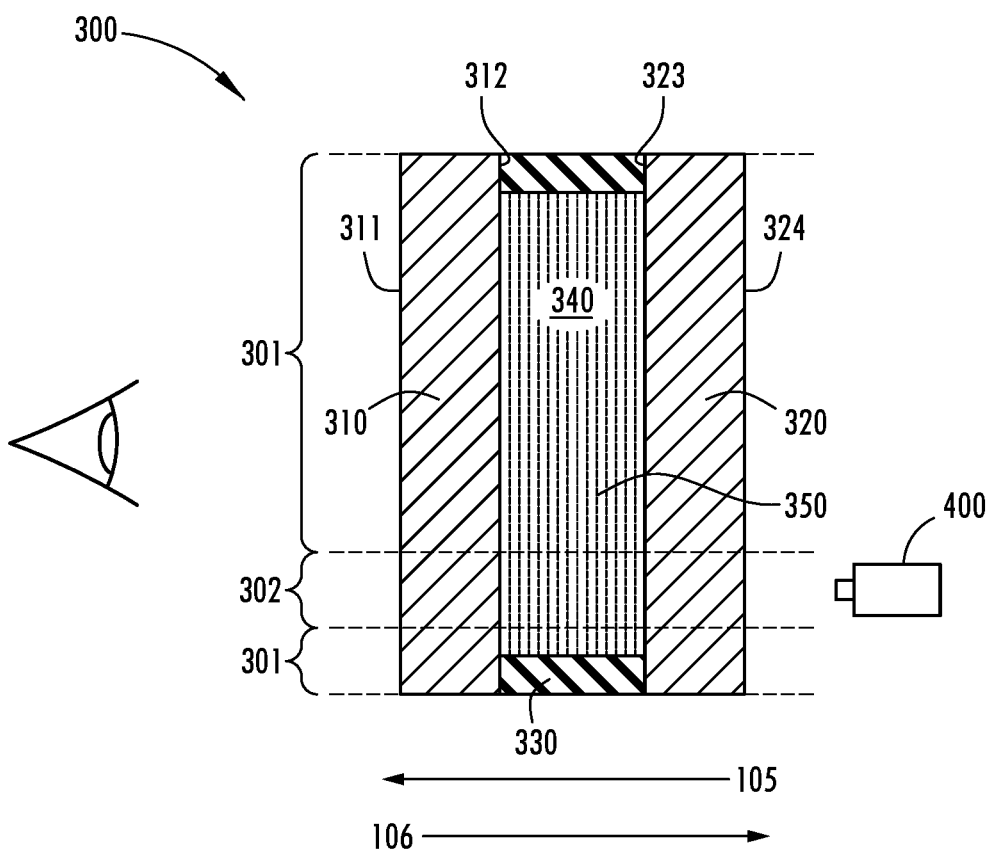
FIG. 3: A cross sectional schematic representation of an embodiment of an electro-optic element.

FIG. 3 is a cross sectional representation of an electro-optic element 300. Electro-optic element 300 may be a rearview assembly. Accordingly, when viewed from a first direction 105, electro-optic element 300 may be operable to show a reflection of a scene in the first direction 105 relative electro-optic element 300. In some embodiments, electro-optic element 300 may be electrochromic. Additionally, Electro-optic element 300 comprises a substantially opaque region 301 and a transflective region 302. Substantially opaque region 301 may be completely or partially reflective. Transflective region 302 may be a device 400 opening region. Accordingly, a device 400, such as a sensor, lighted feature, or display may be optically aligned with transflective region 302 such that device 400 may be operable to receive light through the member at transflective region 302. In embodiments where device 400 is a sensor, the sensor may be an optical sensor such as an imager or a glare light sensor. The imager may be a visible spectrum imager, infra-red spectrum imager, or near infra-red imager. Electro-optic element 300 may further comprise a first substrate 310, a second substrate 320, a seal 330, a chamber 340, and an electro-optic medium 350.

First substrate 310 comprises a first surface 311 and a second surface 312. Further, first substrate 310 may be fabricated from any one of a number of materials that are transparent or substantially transparent in the visible region of the electromagnetic spectrum, such as borosilicate glass, soda lime glass, float glass, natural and synthetic polymeric resins, plastics, and/or composites including Topas®, which is commercially available from Topas Advance Polymers. While particular substrate materials are disclosed, for illustrative purposes only, other materials known in the art may be used. Additionally, second surface 312 may comprise a first electrode. The first electrode is an electrically conductive material. The electrically conductive material is substantially transparent in the visible region and generally resistant to corrosion from materials contained in chamber 340. For example, the electrically conductive material may be a transparent conductive oxide (TCO) such fluorine doped tin oxide (FTO), indium tin oxide (ITO), or indium zinc oxide (IZO) or may be an insulator metal insulator (IMI) type transparent electrode.

Second substrate 320 is disposed in a spaced apart relationship with and disposed in a second direction 106 relative first substrate 310. The second direction 106 is opposite the first direction 105. Second substrate 320 comprises a third surface 323 and a fourth surface 324. Further, second substrate 320 may be any of the members 100, 200 from FIGS. 1a-2c. Additionally, third surface 323 may comprise a second electrode. The second electrode is an electrically conductive material. In some embodiments, the second electrode may second layer 112, 212.

Seal 330 is disposed between the first and second substrates 310, 320 in a peripheral manner to define a chamber 340 in combination with second surface 312 and third surface 323. Further, seal 350 may comprise any material capable of being adhesively bonded to second surface 312 and third surface 323 to in turn seal chamber 340, such that an electro-optic medium 350 does not inadvertently leak out of chamber 340. Alternatively, in some embodiments, seal 330 may be disposed about and extending between the peripheries of the first and second substrates 310, 320. Also, in some embodiments, coating layers disposed between seal 330 and either the first or second substrates 310, 320 may be omitted in an area aligned with seal 330 for various purposes such as adhesion, corrosion resistance, electrical contact, or curing materials of seal 330 with UV light.

Electro-optic medium 350 is disposed in chamber 340. In some embodiments, electro-optic medium 350 may be an electrochromic medium. Further, electro-optic medium 350 is operable to enter an activated state during exposure to an electrical potential. In an activated state, electro-optic medium 350 may be operable to exhibit a change, relative an un-activated state, in its extinction coefficient at one or more wavelengths in the visible spectrum.

In operation, light from the first direction 105 may enter electro-optic element 300, transmit through first substrate 310 and electro-optic medium 350, reflect off second substrate 320 (member 100, 200), and be viewable by an observer disposed in the first direction 105 relative electro-optic element 300. Further, when activated, electro-optic element 300 may reduce the intensity of the reflected light therefrom. The reflection from second substrate 320 (member 100, 200) may be such that transflective region 302 is difficult to discern from opaque region 301, due to low differences in total reflectance and color reflectance. Additionally, the light from the first direction 105 may also be transmitted through second substrate 320 (member 100, 200) at the transflective region such that the light may be sensed by a sensor disposed in the second direction 106 relative electro-optic element 300.

Some embodiments of the present disclosure may have the advantage of a reflective surface having a discreet transflective region 102, 202, 302 due to a small difference in the total reflectance and the a low ΔC* unit between areas within and without transflective region 102, 202, 302. The discreet transflective region 102, 202, 302 has the advantage of a desirable aesthetic appearance where member 100, 200 appears more uniform. Additionally, some embodiments may have the advantage of not requiring a large area since transflective region 102, 202, 302 may be created without a graded transition. Further, some embodiments may have the advantage of one or more or all of the layers being of a high deposition rate material. Accordingly, the achievement of the discreet transflective region 102, 202, 302 via the use of the high deposition rate materials, enables simpler and more cost-effective production.

Examples of electro-optic element 300 with member 100 may be as follows. Unless stated otherwise, the following examples are generating using thin film modeling programs, such as Essential Macleod. First substrate 310 is clear float glass having a thickness of 1.6 mm. Second substrate 320 is member 100. Additionally, first electrode 312 is approximately ITO having a thickness of 120 nm. Further, first substrate 310 and first substrate 110 of member 100 are spaced approximately 135 microns apart.

In one exemplary embodiment, member 100 is as follows. First substrate 110 is clear float glass having a thickness of 1.6 mm. First layer 111 is 17.3 nm of chrome, second layer 112 is 12.3 nm of 7 percent gold and 93 percent silver by weight silver gold alloy, third layer 113 is 26.1 nm of silicon, and fourth layer 114 is 2 nm of ruthenium. The following optical results were actually obtained from a physical sample. At substantially opaque region 101 the total light reflectance is 65.06 percent and the color reflectance is −3.01 for a* and 2.19 for b*. Additionally, the transmittance at substantially opaque region 101 is 4.19 percent and the color transmittance is 1.85 for a* and −2.48 for b*. Similarly, at transflective region 102 the total light reflectance is 64.98 percent and the color reflectance is −4.65 for a* and 2.07 for b*. Additionally, the transmittance at transflective region 102 is 11.87 percent and the color transmittance is 5.79 for a* and 20.18 for b*. Accordingly, in this exemplary embodiment, the total reflectance difference is 0.08 and the ΔC* for is 1.64.

In another exemplary embodiment, member 100 in electro-optic element 300 is as follows. First substrate 110 is clear float glass having a thickness of 1.6 mm. First layer 111 is 21.0 nm of chrome, second layer 112 is 12.3 nm of 7 percent gold and 93 percent silver by weight silver gold alloy, third layer 113 is 29.0 nm of silicon, and fourth layer 114 is 4 nm of ruthenium. Accordingly, at substantially opaque region 101 the total light reflectance is 69.3 percent and the color reflectance is −2.7 for a* and 2.6 for b*. Additionally, the transmittance at substantially opaque region 101 is 2.0 percent and the color transmittance is 1.7 for a* and −0.1 for b*. Similarly, at transflective region 102 the total light reflectance is 69.3 percent and the color reflectance is −3.4 for a* and 2.07 for b*. Additionally, the transmittance at transflective region 102 is 8.5 percent and the color transmittance is 4.7 for a* and 18.6 for b*. Accordingly, in this exemplary embodiment, the total reflectance difference is 0.0 and the ΔC* for is 0.9.

Additional exemplary embodiments of electro-optic element 300 with member 100 are included in Tables 1a-b below. In these examples, various reflectance and transmittance intensities are shown. Additionally, the materials for the first, second, third, and fourth layers 111-114 are varied to demonstrate the achievement of different design qualities by varying the respective layers. Specifically, Table 1a outlines construction of member 100 and Table 1b outlines the resulting properties of member 100 in electro-optic element 300.

TABLE 1a

| Example | First Layer | | Second Layer | | Third Layer | | Fourth Layer | |
|---|---|---|---|---|---|---|---|---|
| | Material | Thickness** | Material | Thickness** | Material | Thickness** | Material | Thickness** |
| 1 | Cr | 48.1 | Ag/Au 7% Au | 7.6 | Si* | 32.0 | Ru | 8.6 |
| 2 | Cr | 51.0 | Ag/Au 7% Au | 12.6 | Si* | 32.8 | Ru | 7.1 |
| 3 | Cr | 105.1 | Ag/Au 7% Au | 18.9 | Si* | 33.9 | Ru | 4.7 |
| 4 | Cr | 56.1 | Ag/Au 7% Au | 4.6 | Si* | 101.4 | Ru | 9.9 |
| 5 | Cr | 62.0 | Ag/Au 7% Au | 4.9 | Ge | 19.4 | Ru | 6.8 |
| 6 | Cr | 66.8 | Ag/Au 7% Au | 19.3 | Ge | 18.5 | Ru | 5.4 |
| 7 | Cr | 63.0 | Ag/Au 7% Au | 8.9 | Ge | 19.3 | Ru | 6.8 |
| 8 | Cr | 69.6 | Ag/Au 7% Au | 7.6 | TiO$_2$ | 54.2 | Ru | 13.9 |
| 9 | Cr | 22.9 | Ag/Au 7% Au | 10.5 | TiO$_2$ | 58.4 | Ru | 8.0 |
| 10 | Cr | 42.8 | Ag/Au 7% Au | 8.3 | SiC | 36.7 | Ru | 9.2 |
| 11 | Cr | 92.3 | Ag/Au 7% Au | 13.8 | SiC | 38.2 | Ru | 6.8 |
| 12a | Cr | 49.7 | Ag/Au 7% Au | 5.2 | Si* | 32.1 | Rhodium | 13.6 |
| 12b | Cr | 58.9 | Ag/Au 7% Au | 6.0 | Si† | 26.2 | Rhodium | 8.6 |
| 13 | Cr | 86.9 | Ag/Au 7% Au | 11.2 | Si† | 25.6 | Mo | 5.0 |
| 14 | Mo | 91.9 | Ag/Au 7% Au | 10.4 | Si† | 23.6 | Ru | 4.8 |
| 15 | Cr | 92.4 | Ag/Cu 13% Cu | 10.1 | Si† | 26.1 | Ru | 4.7 |
| 16 | Cr | 46.0 | Ag/Au 7% Au | 8.4 | SiC*/Cr | 28.0/9.0 | Ru | 0.5 |

*Deposed by high pressure deposition processes known in the art to achieve a high refractive index.
†Deposed by high power deposition processes known in the art to achieve high refractive index.
**Thicknesses are measured in nm.

TABLE 1b

| | Opaque Region | | | | Transflective Region | | | | | | Difference | |
|---|---|---|---|---|---|---|---|---|---|---|---|---|
| Example | $Y_T$ | $Y_R$ | $a^*_R$ | $b^*_R$ | $Y_T$ | $a^*_T$ | $b^*_T$ | $Y_R$ | $a^*_R$ | $b^*_R$ | $\Delta Y$ | $\Delta C^*$ |
| 1 | 0.0 | 65.1 | −2.3 | 0.2 | 9.8 | 3.6 | 18.6 | 64.8 | −3.3 | 0.9 | 0.3 | 1.3 |
| 2 | 0.0 | 70.7 | −2.2 | 0.4 | 8.8 | 4.0 | 17.4 | 68.8 | −3.4 | 0.9 | 1.9 | 1.3 |
| 3 | 0.0 | 76.2 | −2.1 | 0.5 | 7.8 | 4.5 | 15.7 | 72.8 | −3.4 | 1.0 | 3.4 | 1.4 |
| 4 | 0.0 | 61.6 | −2.2 | −0.1 | 4.6 | 9.9 | 31.9 | 57.5 | −4.1 | 0.8 | 4.0 | 2.0 |
| 5 | 0.0 | 61.0 | −2.4 | −0.2 | 6.4 | 2.7 | 10.4 | 58.1 | −2.2 | −0.7 | 2.9 | 0.6 |
| 6 | 0.0 | 76.6 | −2.1 | 0.5 | 3.7 | 2.5 | 7.6 | 72.2 | −2.4 | −0.4 | 4.3 | 1.0 |
| 7 | 0.0 | 66.2 | −2.3 | 0.2 | 5.4 | 2.7 | 9.8 | 62.7 | −2.3 | −0.7 | 3.5 | 0.8 |
| 8 | 0.0 | 66.3 | −2.1 | 0.2 | 8.7 | −2.6 | 3.5 | 63.3 | −2.2 | −0.3 | 3.0 | 0.6 |
| 9 | 0.0 | 68.5 | −2.2 | 0.3 | 15.0 | −2.0 | 2.9 | 60.2 | −2.7 | −0.2 | 8.3 | 0.7 |
| 10 | 0.0 | 66.1 | −2.2 | 0.2 | 9.6 | 0.8 | 10.4 | 63.2 | −2.6 | 0.1 | 2.9 | 0.4 |
| 11 | 0.0 | 71.8 | −2.2 | 0.4 | 9.3 | 1.3 | 9.4 | 67.1 | −2.8 | 0.3 | 4.8 | 0.6 |
| 12a | 0.0 | 65.4 | −1.5 | 1.4 | 9.6 | 5.4 | 19.7 | 64.4 | −3.2 | 1.5 | 1.0 | 1.8 |
| 12b | 0.0 | 65.2 | −1.8 | 0.9 | 9.9 | 5.8 | 19.7 | 64.6 | −3.4 | 1.3 | 0.6 | 1.7 |
| 13 | 0.0 | 65.0 | −1.7 | 1.7 | 10.6 | 6.1 | 18.9 | 65.0 | −3.9 | 1.6 | 0.0 | 2.2 |
| 14 | 0.0 | 65.0 | −2.3 | 0.5 | 10.4 | 4.8 | 18.7 | 65.0 | −4.0 | −1.0 | 0.0 | 2.3 |
| 15 | 0.0 | 65.1 | −2.3 | 1.0 | 9.9 | 4.7 | 18.9 | 64.7 | −3.5 | 1.6 | 0.4 | 1.3 |
| 16 | 0.4 | 65.0 | −3.2 | 1.9 | 12.5 | 4.6 | 19.2 | 62.6 | −5.6 | 1.1 | 2.4 | 2.5 |

Figure 4:
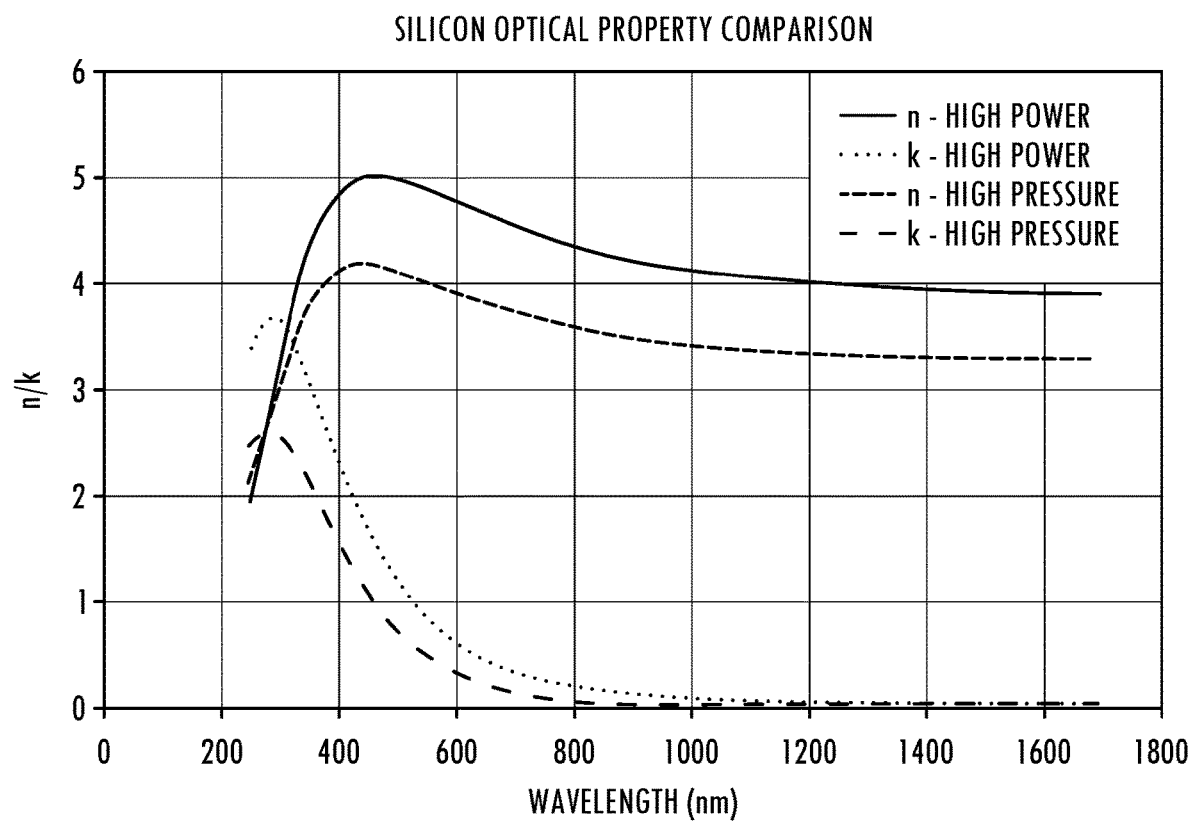
FIG. 4: A graph comparing the optical properties of silicon for use in the third layer.

Examples 12a and 12b from Tables 1a-b demonstrate the effect of refractive index of semiconducting silicon on member 100. Further, FIG. 4, is a graph comparing the optical properties of silicon. Specifically, the optical constants refractive index (n) and extinction coefficient (k) are plotted as a function the wavelength of light. One set of curves is for embodiments where silicon is deposed by high power deposition processes known in the art, and the other set is for embodiments where silicon is deposed by high pressure processes known in the art. Accordingly, it is shown that the refractive index and extinction coefficient vary with the different deposition methods. However, examples 12a and 12b demonstrate that similar optical performances may be obtained with different optical constants when the thickness of fourth layer 114 are adjusted to get the same reflectance and transmittance performance for electro-optic element 300.

Example 16 demonstrates that third layer 113 may comprise multiple sublayers. Specifically, in example 16, third layer 113 comprises a semiconductor, silicon, and a metal, chrome. Various other combinations of sublayers may be used.

Figure 5:
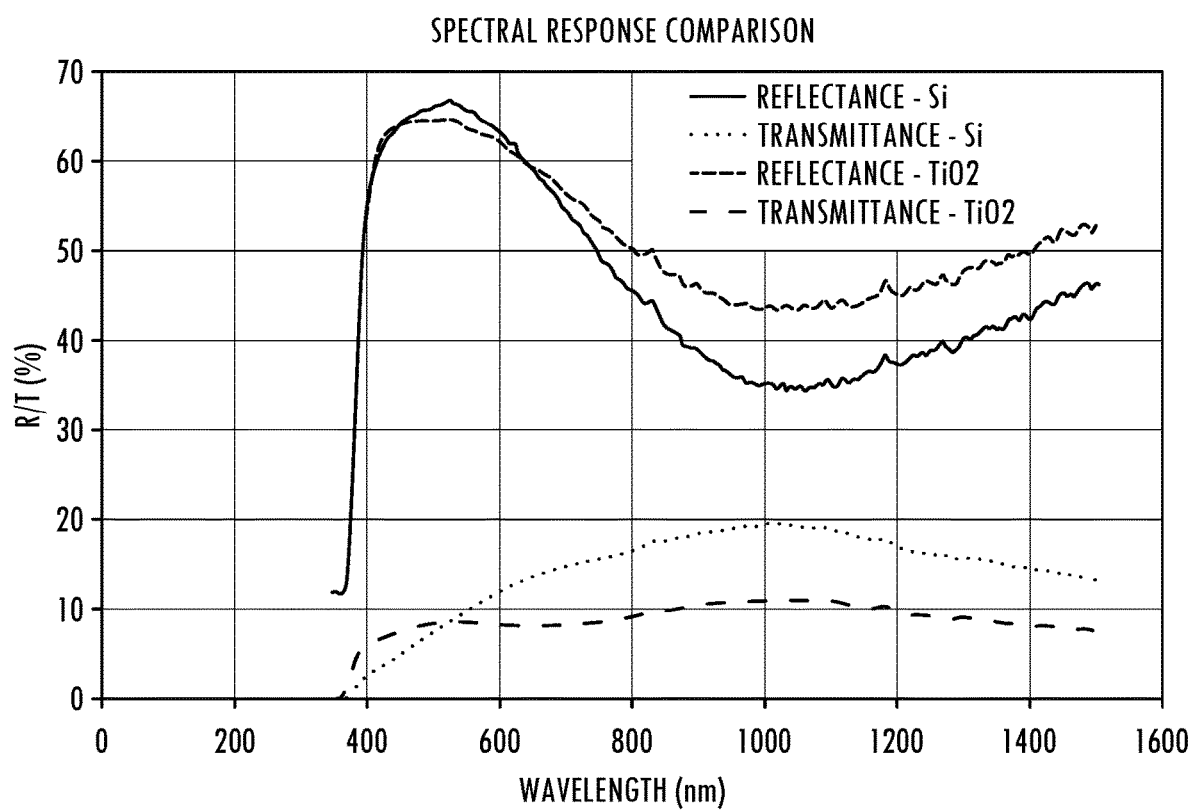
FIG. 5: A graph comparing the visible light demonstrating the effect of a third layer comprised of semiconductors on transmittance.

A comparison of examples 1 and 8 demonstrates that comparable visible light reflectance and transmittance values—approximately 65% and 9%, respectively—may be achieved both with and without using semiconductors in third layer 113. However, as shown in FIG. 5, whether third layer 113 is comprised of semiconductors may have a significant effect on the transmittance of member 100 in the NIR region. Specifically, at approximately 1000 nm, example 1 with silicon may have 1.75 times the transmittance of example 8 with $SiO_2$.

Examples of electro-optic element 300 with member 200 may be as follows. First substrate 310 is clear float glass having a thickness of 1.6 mm. Second substrate 320 is member 200. Additionally, first electrode 312 is approximately ITO having a thickness of 120 nm. Further, first substrate 310 and first substrate 210 of member 200 are spaced approximately 135 microns apart.

In one exemplary embodiment, member 200 with electro-optic element 300 is as follows. First substrate 210 is clear float glass having a thickness of 1.6 mm. First layer 211 is 50 nm of chrome, second layer 212 is 20 nm of 7 percent gold and 93 percent silver by weight silver gold alloy, third layer 213 is 30 nm of silicon, and fourth layer 214 is 0.2 nm of ruthenium. Accordingly, for substantially opaque region 201, the total light reflectance is 49.5 percent and the transmittance is 0.1 percent. Additionally, for transflective region 202, the total light reflectance is 46.4 percent and the transmittance is 9.7 percent. Further, the difference in reflectance is approximately 3 percent and the $\Delta C^*$ is 4.1 units.

Additional exemplary embodiments of electro-optic element 300 with member 200 are included in Tables 2a-b. In these examples, various reflectance and transmittance intensities are shown. Additionally, the materials for the first, second, third, and fourth layers 211-214 are varied to demonstrate the achievement of different design qualities by varying the respective layers. Specifically, Table 2a outlines construction of member 200 and Table 2b outlines the resulting properties of member 200.

TABLE 2a

| | First Layer | | Second Layer | | Third Layer | | Fourth Layer | |
|---|---|---|---|---|---|---|---|---|
| Example | Material | Thickness** | Material | Thickness** | Material | Thickness** | Material | Thickness** |
| 1 | Cr | 55.0 | Ag/Au 7% Au | 25.0 | Si* | 25.0 | Ru | 8.6 |
| 2 | Cr | 55.0 | Ag/Au 7% Au | 21.6 | Si* | 25.0 | $TiO_2$/ITO/Ru | 27.7/36.5/0.5 |

*Deposed by high pressure deposition processes known in the art to achieve a high refractive index.

†Deposed by high power deposition processes known in the art to achieve high refractive index.

**Thicknesses are measured in nm.

TABLE 2b

| | Opaque Region | | | | Transflective Region | | | | | | Difference | |
|---|---|---|---|---|---|---|---|---|---|---|---|---|
| Example | $Y_T$ | $Y_R$ | $a^*_R$ | $b^*_R$ | $Y_T$ | $a^*_T$ | $b^*_T$ | $Y_R$ | $a^*_R$ | $b^*_R$ | $\Delta Y$ | $\Delta C^*$ |
| 1 | 0.1 | 64.4 | −1.4 | 5.3 | 10.6 | −2.0 | 3.8 | 65.9 | −1.1 | 7.7 | −1.5 | 2.4 |
| 2 | 0.1 | 70.2 | −3.3 | 2.8 | 9.6 | 2.6 | 14.0 | 69.8 | −3.3 | 3.3 | 0.5 | 0.5 |

In this document, relational terms, such as "first," "second," and the like, are used solely to distinguish one entity or action from another entity or action, without necessarily requiring or implying any actual such relationship or order between such entities or actions.

As used herein, the term "and/or," when used in a list of two or more items, means that any one of the listed items can be employed by itself, or any combination of the two or more of the listed items can be employed. For example, if a composition is described as containing components A, B, and/or C, the composition can contain A alone; B alone; C alone; A and B in combination; A and C in combination; A and C in combination; B and C in combination; or A, B, and C in combination.

As used herein, "about" will be understood by persons of ordinary skill in the art and will vary to some extent depending upon the context in which it is used. If there are uses of the term which are not clear to persons of ordinary skill in the art, given the context in which it is used, "about" will mean up to plus or minus 10% of the particular term.

The term "substantially," and variations thereof, will be understood by persons of ordinary skill in the art as describing a feature that is equal or approximately equal to a value or description. For example, a "substantially planar" surface is intended to denote a surface that is planar or approximately planar. Moreover, "substantially" is intended to denote that two values are equal or approximately equal. If there are uses of the term which are not clear to persons of ordinary skill in the art, given the context in which it is used, "substantially" may denote values within about 10% of each other, such as within about 5% of each other, or within about 2% of each other.

The term "transparent" is applied in the relative sense. "Transparent" refers to an optical element or material that is substantially transmissive of at wavelengths in question and thus generally allows light at such wavelengths to pass therethrough. The wavelengths in question will vary based on the context. However, in the event the wavelengths in question is not readily apparent, the wavelengths in question shall generally refer to visible light.

The term "transflective" generally refers to an optical configuration that reflects at least a portion of light incident from at least one side and transmits at least a portion of light incident from at least one side. In particular, "transflective" describes an optical element or component that has a non-zero level of transmittance with regard to a wave range of light and also has a non-zero level of reflectance in a region. The applicable wave range of light will vary based on the context. However, in the event the relevant wave range of light is not readily apparent, the wave range in light shall generally refer to visible light.

The term "opaque" is applied in the relative sense. "Opaque" refers to an optical element or material that is not appreciably transparent or translucent at wavelengths in question and thus generally does not allow light at such wavelengths to pass therethrough. The wavelengths in question will vary based on the context. However, in the event the wavelengths in question is not readily apparent, the wavelengths in question shall generally refer to visible light.

The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element preceded by "comprises . . . a" does not, without more constraints, preclude the existence of additional identical elements in the process, method, article, or apparatus that comprises the element.

It is to be understood that although several embodiments are described in the present disclosure, numerous variations, alterations, transformations, and modifications may be understood by one skilled in the art, and the present disclosure is intended to encompass these variations, alterations, transformations, and modifications as within the scope of the appended claims, unless their language expressly states otherwise.

What is claimed is:

1. A device comprising:
   a member having:
      a substantially opaque region comprising:
         a first substrate substantially transparent in the visible spectrum,
         a first layer disposed in a first direction relative the first substrate, the first layer substantially opaque in the visible spectrum, and
         a second layer disposed in a second direction relative the first substrate, the second layer substantially reflective in the visible spectrum, the second direction opposite the first direction; and
      a sensor opening region defined by an absence of the first layer, the sensor opening region comprising:
         the first substrate,
         a third layer having a high refractive index, the third layer disposed in the first direction relative the first substrate, and
         the second layer disposed in the second direction relative the third layer;
   wherein:
      when viewed from the second direction:
         the difference between a total light reflectance of the member at the substantially opaque region and at the sensor opening region is less than five percent, and
         the difference between a color reflectance of the member at the substantially opaque region and at the sensor opening region is less than 5 $\Delta C^*$ units; and
   a sensor disposed in the first direction of the sensor opening region of the member is operable to receive light through the member at the sensor opening region.

2. The device of claim 1, wherein the member further comprises a fourth layer disposed between the second layer and the first substrate.

3. The device of claim 2, wherein the fourth layer is ruthenium.

4. The device of claim 1, wherein the refractive index of the third layer is at least about 1.9.

5. The device of claim 1, wherein the second layer is at least one of silver and silver alloy.

6. The device of claim 1, further comprising:
   a second substrate disposed in a spaced apart relationship in the second direction relative the member, the second substrate comprising a first electrode; and
   an electro-optic medium disposed between the member and the second substrate;
   wherein the member comprises a second electrode.

7. The device of claim 6, wherein the second layer is the second electrode.

8. The device of claim 1, wherein the transmittance of visible light at the sensor opening region is about 7 to 15 percent.

9. The device of claim 1, wherein: the substantially opaque region further comprises the third layer disposed in the first direction relative the first layer.

10. The device of claim 1, wherein the third layer is substantially limited to the sensor opening region.

* * * * *